(12) United States Patent
Kim et al.

(10) Patent No.: US 11,035,882 B2
(45) Date of Patent: Jun. 15, 2021

(54) SIGNAL TRANSFER STRUCTURE FOR TEST EQUIPMENT AND AUTOMATIC TEST APPARATUS FOR TESTING SEMICONDUCTOR DEVICES USING THE SAME

(71) Applicant: SAMSUNG ELECTRONICS CO., LTD., Suwon-si (KR)

(72) Inventors: Jae-Hyun Kim, Hwaseong-si (KR); Jong-Jin An, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 112 days.

(21) Appl. No.: 16/430,618

(22) Filed: Jun. 4, 2019

(65) Prior Publication Data

US 2020/0132721 A1 Apr. 30, 2020

(30) Foreign Application Priority Data

Oct. 26, 2018 (KR) .......................... 10-2018-0128829

(51) Int. Cl.
  *G01R 1/04* (2006.01)
  *G01R 31/26* (2020.01)
  *G01R 31/28* (2006.01)

(52) U.S. Cl.
  CPC ....... *G01R 1/0416* (2013.01); *G01R 31/2601* (2013.01); *G01R 31/2834* (2013.01)

(58) Field of Classification Search
  CPC .............. G01R 1/0416; G01R 31/2601; G01R 31/2834; G01R 1/07378; H01R 31/005; H01R 13/02; H01R 2201/20

USPC ......................................................... 324/527
See application file for complete search history.

(56) References Cited

U.S. PATENT DOCUMENTS

| 6,400,234 | B1 | 6/2002 | Ohhashi et al. |
| 6,441,471 | B1 | 8/2002 | Maetani |
| 6,717,071 | B2 | 4/2004 | Chang et al. |
| 7,294,904 | B1 | 11/2007 | Chee et al. |
| 7,404,250 | B2 | 7/2008 | Cheng et al. |
| 8,354,601 | B2 | 1/2013 | Russell |
| 8,878,074 | B2 | 11/2014 | Moeller et al. |
| 9,041,208 | B2 | 5/2015 | Gallegos et al. |
| 9,472,873 | B1 * | 10/2016 | Jeong .................. H01R 24/60 |

(Continued)

FOREIGN PATENT DOCUMENTS

| JP | 3309056 B2 | 7/2002 |
| JP | 2004-0259960 A | 9/2004 |

(Continued)

*Primary Examiner* — Christopher P McAndrew
(74) *Attorney, Agent, or Firm* — Lee IP Law, P.C.

(57) ABSTRACT

A signal transfer structure including a tapered input line extending in a first direction and having an input terminal and a contact terminal, a width of the input line increasing from the input terminal to the contact terminal in the first direction and a signal being input to the input terminal; a diverging line in contact with the contact terminal of the input line and extending in a second direction different from the first direction; an output line connected to the diverging line and from which the signal is output; and an interconnector, the interconnector including a vertical via between the diverging line and the output line and a via line connected to the vertical via and having a same characteristic impedance as the output line.

20 Claims, 8 Drawing Sheets

(56) References Cited

U.S. PATENT DOCUMENTS

| | | | | |
|---|---|---|---|---|
| 2013/0106456 A1* | 5/2013 | Weikle, II | ............... | G01R 3/00 324/754.06 |
| 2017/0047696 A1* | 2/2017 | Li | ....................... | H01R 13/405 |
| 2017/0133736 A1* | 5/2017 | Kim | .................. | G01R 31/2877 |

FOREIGN PATENT DOCUMENTS

| | | | |
|---|---|---|---|
| JP | 5417622 B2 | 2/2014 | |
| KR | 10-2018-0071611 A | 6/2018 | |

* cited by examiner

SIGNAL TRANSFER STRUCTURE FOR TEST EQUIPMENT AND AUTOMATIC TEST APPARATUS FOR TESTING SEMICONDUCTOR DEVICES USING THE SAME

CROSS-REFERENCE TO RELATED APPLICATIONS

Korean Patent Application No. 10-2018-0128829 filed on Oct. 26, 2018 in the Korean Intellectual Property Office, and entitled: "Signal Transfer Structure for Test Equipment and Automatic Test Apparatus for Testing Semiconductor Devices Using the Same," is incorporated by reference herein in its entirety.

BACKGROUND

1. Field

Embodiments relate to a signal transfer structure for test equipment and an automatic test apparatus for testing semiconductor devices using the same.

2. Description of the Related Art

Some automatic test equipment (ATE) can simultaneously transfer a single test signal to a plurality of devices under test (DUT) from a single resource channel. A test signal may be applied to an input line and then may be diverged into a plurality of branch lines from the single input line. Then, a plurality of diverged signals may be transferred to each DUT via the branch lines, respectively. The branch line may function as an output line in the ATE.

SUMMARY

The embodiments may be realized by providing a signal transfer structure including a tapered input line extending in a first direction and having an input terminal and a contact terminal, a width of the input line increasing from the input terminal to the contact terminal in the first direction and a signal being input to the input terminal; a diverging line in contact with the contact terminal of the input line and extending in a second direction different from the first direction; an output line connected to the diverging line and from which the signal is output; and an interconnector, the interconnector including a vertical via between the diverging line and the output line and a via line connected to the vertical via and having a same characteristic impedance as the output line.

The embodiments may be realized by providing a signal transfer structure including a tapered input line extending in a first direction and having an increasing width along the first direction such that the input line is separated into a first separation line having an input terminal to which a signal is input and a second separation line having a contact terminal at different level; a diverging line in contact with the contact terminal of the input line and extending in a second direction that is different from the first direction; an output line directly connected to the diverging line and from which the signal is output; and an interconnector interconnecting the first separation line and the second separation line and having a first via, a second via, and a via line such that: the first via extends upwardly from the first separation line in a third direction that is substantially perpendicular to the first and the second directions to thereby make contact with the via line; the second via extends downwardly from the second separation line in the third direction to thereby make contact with the via line; and the via line has a substantially same characteristic impedance as those of the first separation line and the second separation line.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
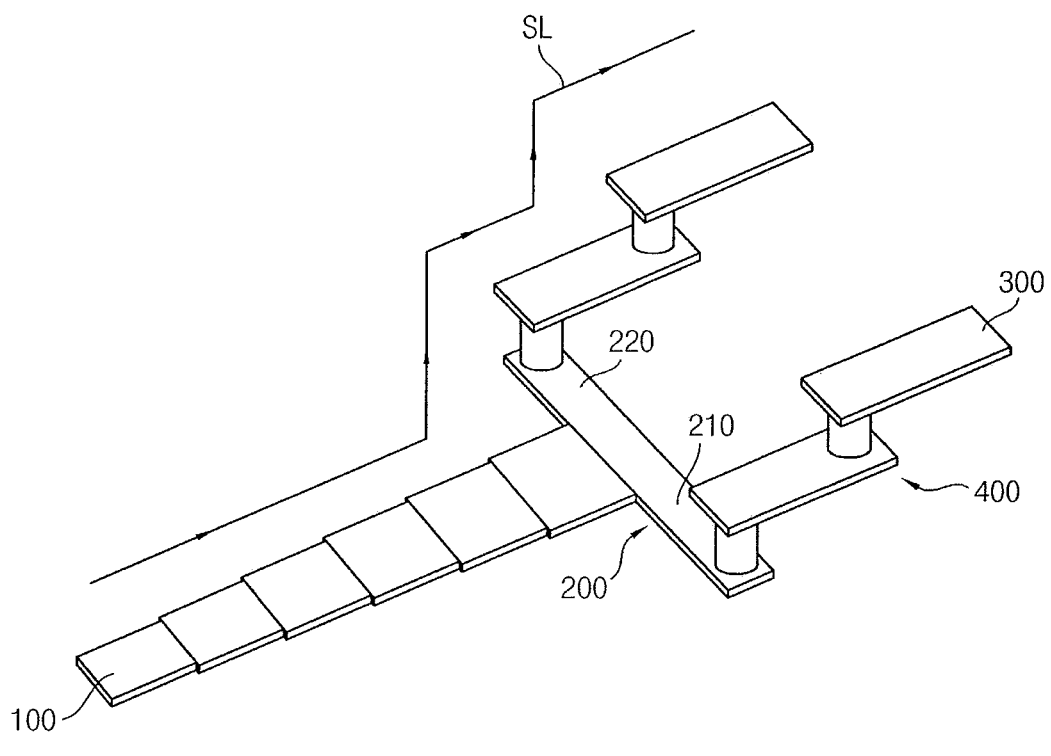
FIG. 1 illustrates a perspective view of a signal transfer structure for transferring signals in accordance with an example embodiment.
Figure 1:
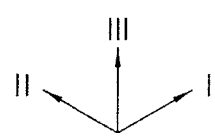
Figure 2:
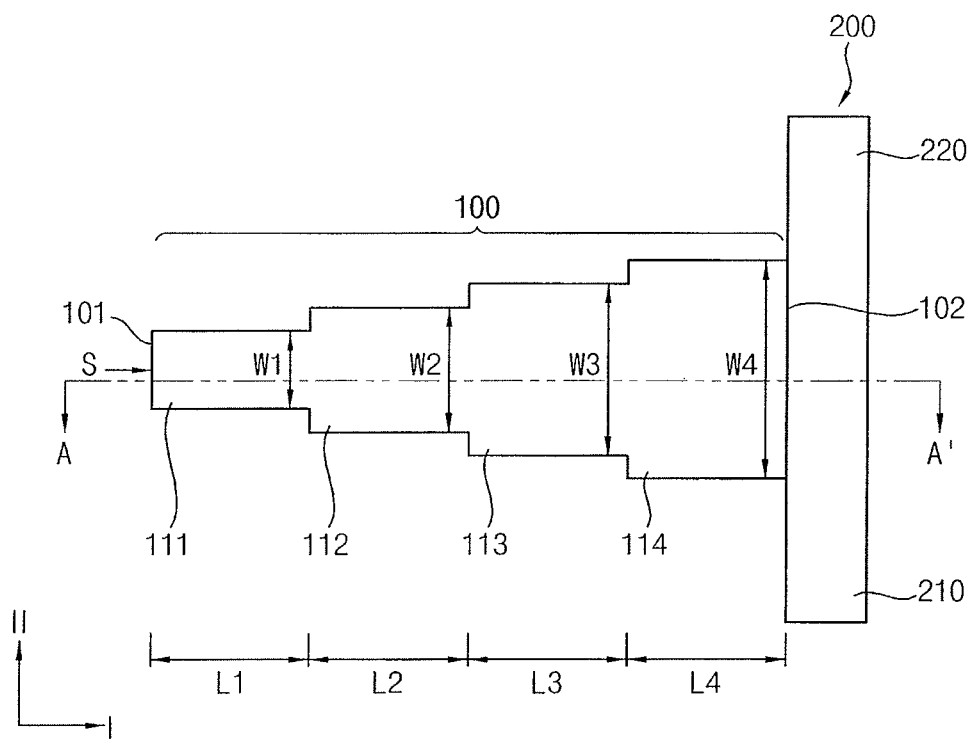
FIG. 2 illustrates a plan view of a contact structure of the input line and the diverging line of the signal transfer structure shown in FIG. 1 in accordance with an example embodiment.
Figure 3:
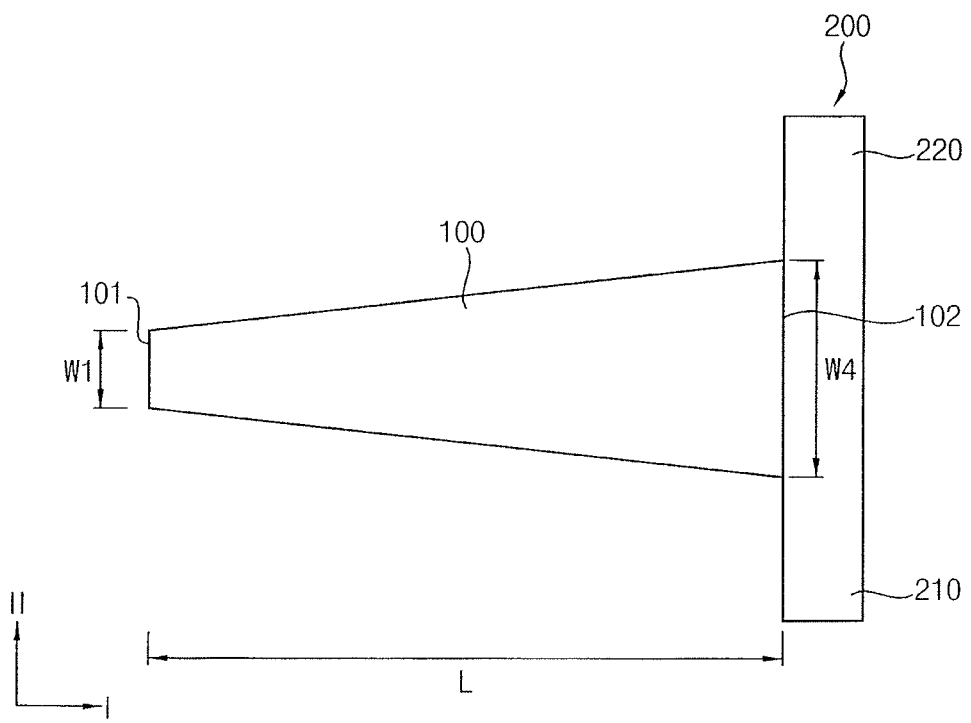
FIG. 3 illustrates a plan view of a contact structure of the input line and the diverging line of the signal transfer structure shown in FIG. 1 in accordance with another example embodiment.

FIG. 1 illustrates a perspective view of a signal transfer structure for transferring signals in accordance with an example embodiment. FIG. 2 illustrates a plan view of a contact structure of the input line and the diverging line of the signal transfer structure shown in FIG. 1 in accordance with an example embodiment. FIG. 3 illustrates a plan view of a contact structure of the input line and the diverging line of the signal transfer structure shown in FIG. 1 in accordance with another example embodiment.

Referring to FIGS. 1 to 3, a signal transfer structure 500 in accordance with an example embodiment may include a tapered input line 100 extending (e.g., lengthwise) in a first direction I and having an input terminal 101 and a contact terminal 102. In an implementation, a width W of the input line 100 may increase from the input terminal 101 to the contact terminal 102 (e.g., along the first direction I). A signal S may be applied to the input terminal 101. The signal transfer structure 500 may include a diverging line 200 in contact with the contact terminal 102 of the input line 100 and extending (e.g., lengthwise) in a second direction II that different from the first direction I. The signal transfer structure 500 may include an output line 300 connected to the diverging line 200 and from which the signal S may be output. The signal transfer structure 500 may include an interconnector 400 (having a vertical via) between the diverging line 200 and the output line 300. The interconnector 400 may include a via line (430, see FIG. 5) connected to the vertical via and having a same characteristic impedance as the output line 300.

For example, the input line 100 may be provided as a strip line extending in the first direction I and shaped into a taper of which the width W (e.g., as measured in the second direction II) thereof increases along the first direction I. The diverging line 200 may include a strip line extending in the second direction II and in contact with the contact terminal 102.

A first end of the input line 100 may be provided as the input terminal 101 and a second end (opposite to the first end of the input line 10)0 may be provided as the contact terminal 102. The diverging line 200 may contact the contact terminal 102 (of the input line 100), and the output line 300 may be connected to the diverging line 200 by the interconnector 400. A signal (e.g., a test signal for testing semiconductor devices under test (DUT)) may be applied to the input terminal 101, and may be transferred to the contact terminal 102. Then, the signal may be diverged (e.g., split) by the diverging line 200 at the contact terminal 102 and may be transferred to each output line 300 that are ultimately connected with each diverging line 200 through the interconnector 400. Finally, the signal may be output from the output line 300 and may be applied to each DUT. A test process may be conducted to each DUT by using the signal.

For example, the input line 100 may include a plurality of line segments of which the width W may increase step by step (e.g., in a stepwise manner along the first direction I). For example, the input line 100 may include a first segment 111 having a first length L1 (in the first direction I) and a first width W1 (in the second direction II), a second segment 112 having a second length L2 and a second width W2, a third segment 113 having a third length L3 and a third width W3 and a fourth segment 114 having a fourth length L4 and a fourth width W4. The number of the segments and the length and the width of each segment may be selected in such a way that an overall impedance of the input line may sufficiently match that of the diverging line 200. For example, when the impedance matching is completed between the input line 100 and the diverging line 200, the impedance discontinuity may be removed in the assembly of the input line 100 and the diverging line 200.

In the present example embodiment, the lengths of all the segments 111 to 114 may be the same and the widths of all the segments 111 to 114 may increase in a step by step manner for the impedance matching. For example, the first to fourth lengths L1 to L4 may be identical to one another, and the first to fourth widths W1 to W4 may sequentially increase in a step by step manner in the named order.

In an implementation, the impedance matching between the input line 100 and the diverging line 200 may be achieved by varying width W1 to W4 of each line segment of the input line 100 while maintaining the constant length L1 to L4. In an implementation, the impedance matching between the input line 100 and the diverging line 200 may be achieved by varying length L1 to L4 of each line segment of the input line 100 while maintaining a constant with W1 to W4.

In an implementation, four line segments of the input line 100 may be included for the impedance matching. In an implementation, the number of the line segments may also be varied according to the contact structures of the input line 100 and the diverging line 200.

In an implementation, as shown in FIG. 3, the impedance matching may be continuously achieved between the input terminal 101 and the contact terminal 102, and the number of the line segments may be infinite along a whole length of the input line 100. For example, the input line 100 may be shaped into a continuous taper in which the width continuously increases from the first width W1 to the fourth W4 (e.g., along the first direction I).

For example, the impedance of each infinite segment may be matched with that of a neighboring infinite segment between the input terminal 101 and the contact terminal 102 and the matched impedance at each point of the input line 100 may be determined by an impedance function that may be continuous along the whole length L of the input line 100. The characteristic impedance of the contact terminal 102 may be determined in such a way that the impedance may be matched between the contact terminal 102 and the diverging line 200, and the characteristic impedance of the contact terminal 102 may be continuously changed toward the input terminal 101 by the impedance function in such a way that the impedance may be matched along a whole length L of the input line 100. As a result, the impedance of the input terminal 101 may be determined by the impedance function.

The diverging line 200 may be in contact with the contact terminal 102 of the input line 100 and may diverge (e.g., split or separate) into a plurality of branch lines 210 and 220. For example, the signal S may be diverged in various directions along each branch line 210 and 220. Each of the branch line 210 and 220 may be individually connected to a plurality of the output lines 300 via the interconnector 400. The DUT may be individually connected to each of the output lines 300. For example, a plurality of the DUTs may be tested by a single test signal that may be applied to the input terminal 101.

The configurations and structures of the diverging line 200 may be changed for the impedance matching to the input line 100. The diverging line 200 may have various suitable configurations and structures as long as the impedance matching with the input line 100 may be sufficiently achieved. In an implementation, the diverging line 200 may extend in the second direction II substantially perpendicular to the first direction I, so a first branch line 210 may extend to the right of the input line 100 and a second branch line 220 may extend to the left of the input line 100. For example, a single signal S may be diverged into (e.g., may separately extend along) two opposite directions.

In an implementation, the input line 100 and the diverging line 200 may include the same signal cable for transferring high frequency signals. In an implementation, the input line 100 and the diverging line 200 may have different structures.

Figure 4:
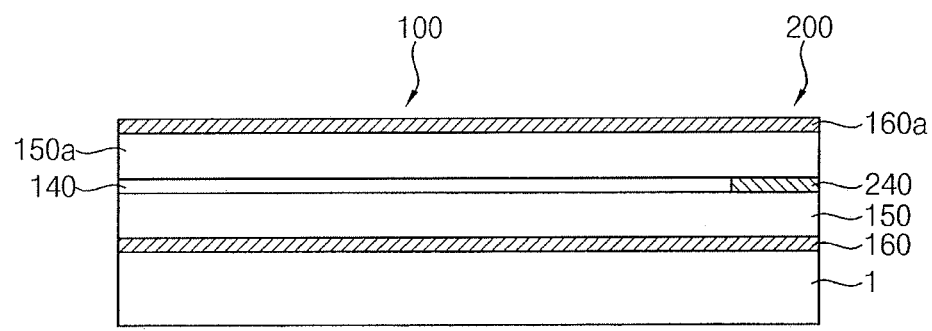
FIG. 4 illustrates a cross sectional view along a line A-A' of FIG. 2.

FIG. 4 illustrates a cross sectional view along a line A-A' of FIG. 2.

Referring to FIG. 4, the input line 100 may include a first conductive line 140 that may be enclosed (e.g., covered on upper and lower sides) by a lower dielectric layer 150 and an upper dielectric layer 150a and a lower ground layer 160 and an upper ground layer 160a on a substrate 1. The diverging line 200 may include a second conductive line 240 that may be enclosed by the upper and lower dielectric layers 150 and 150a and the upper and lower ground layers 160 and 160a on the substrate 1. The input line 100 and the diverging line 200 may be integrally formed into one body on the same substrate 1.

For example, the substrate 1 may include a printed circuit board (PCB) or a flexible board in which a plurality of electric circuits may be printed into a multilayer structure.

The lower ground layer 160 and the lower dielectric layer 150 may be sequentially formed on the substrate 1 and the first and the second conductive layers 140 and 240 may be simultaneously formed on the lower dielectric layer 150. For example, the first and the second conductive layers 140 and 240 may be integrally formed on the lower dielectric layer 150 as one body (e.g., having a monolithic structure). Then, the upper dielectric layer 150*a* and the upper ground layer 160*a* may be sequentially formed on the first and the second conductive layers 140 and 240. Thus, the first and the second conductive layers 140 and 240 may be enclosed by the lower and the upper dielectric layers 150 and 150*a*, and the lower and the upper dielectric layers 150 and 150*a* may be enclosed by the lower and upper ground layers 160 and 160*a*. Thus, the input line 100 and the diverging line 200 may be simultaneously formed on the substrate 1 in such a configuration that the first and the second conductive layers 140 and 240 may be enclosed by the dielectric layers 150 and 150*a* and by the dielectric layers 160 and 160*a*.

The first and the second conductive lines 140 and 240 may include suitable conductive materials, e.g., low resistive metals and nitrides of the metal. The signal S may include various digital signals along wide frequency ranges. For example, the first and the second conductive lines 140 and 240 enclosed by the lower and the upper dielectric layers 150 and 150*a* may constitute a transmission line for transferring high frequency signals. A plurality of the transmission lines may be stacked on the substrate 1 in such a configuration that the neighboring transmission lines may be separated by the ground. Therefore, the output line 300 may also be stacked on the same substrate 1 (along with the input line and the diverging line 200). For example, the input line 100, the diverging line 200 and the output line 300 may have the same structures and configurations on the same substrate 1. In such a case, the transmission lines on the substrate 1 may be divided into the input line 100, the diverging line 200 and the output line 300 according to their own function.

The signal S may include a baseband digital signal. The baseband signal may be applied to the input terminal 101 with a frequency corresponding to an integer times the basic frequency, the reflection of the signal may minimized at an impedance discontinuity point. The basic frequency indicates a half of the minimal frequency at which the signal reflection may be zero or minimized. For that reason, a baseband digital signal may be used for a test signal for testing semiconductor devices at a speed of 3.2 Gbps, and the baseband signal need be applied to the input terminal 101 with the wavelength of 1.6×n GHz (n is an integer) such as 1.6 GHz, 3.2 GHZ, 4.8 GHz, etc.

In such a case, the shape factor such as the length and width of the line segment may be controlled in such a way that the impedance match may be achieved between the input line 100 and the diverging line 200 in view of the wavelength of the baseband signal.

The output line 300 may be spaced apart from the diverging line 200 and may be connected to the diverging line 200 through the interconnector 400.

Figure 5:
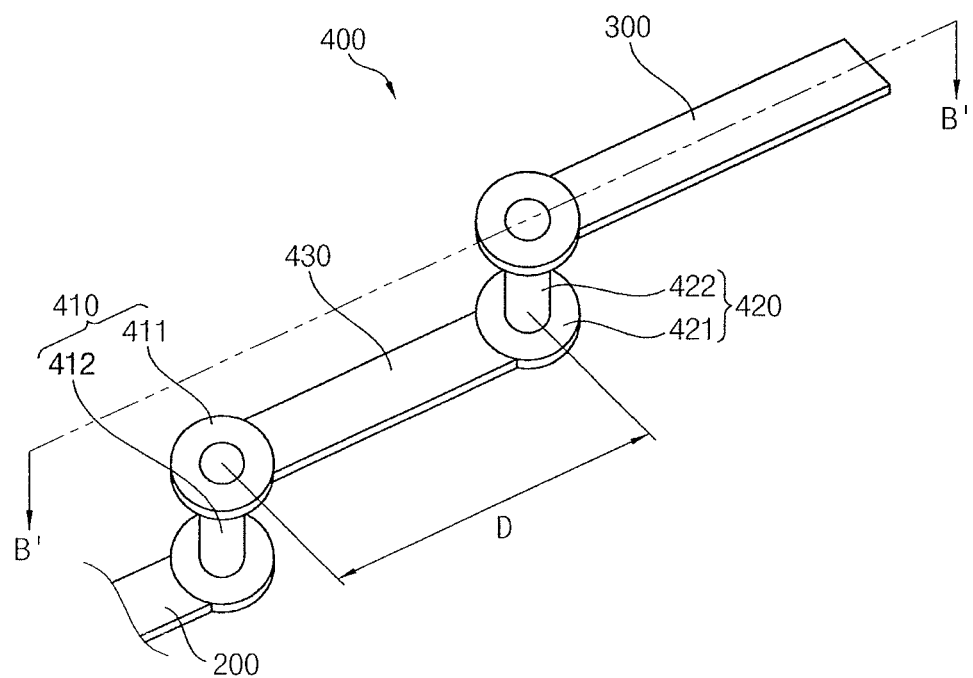
FIG. 5 illustrates a perspective view of the interconnector of the signal transfer structure shown in FIG. 1 accordance with an example embodiment.
Figure 6:
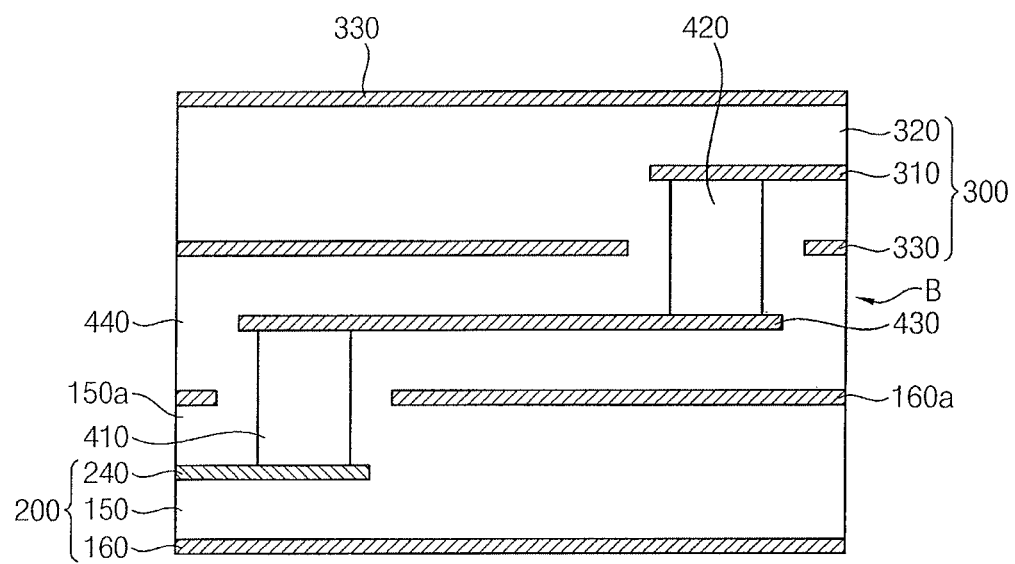
FIG. 6 illustrates a cross sectional view along a line B-B' of FIG. 5.

FIG. 5 illustrates a perspective view of the interconnector of the signal transfer structure shown in FIG. 1 accordance with an example embodiment. FIG. 6 illustrates a cross sectional view cut along a line B-B' of FIG. 5.

Referring to FIGS. 5 and 6, the output line 300 may be spaced apart from the diverging line 200 in the third direction III and may extend in the first direction I.

In the present example embodiment, the output line 300 may have substantially the same structures as the input line 100 and the diverging line 200. For example, the output line 300 may include a transmission line for transmitting the high frequency signal. For example, the output line 300 may include a third conductive line 310 enclosed by an output ground layer 330 and an output dielectric layer 320. The third conductive line 310 of the output line 300 may have substantially the same structures as the first and the second conductive lines 140 and 240 of the input line 100 and the diverging line 200.

In an implementation, a signal receiver to which the signal S may be received may be arranged at an end of the output line 300. For example, the signal transfer structure 500 may be used in a test apparatus for testing semiconductor devices, and the signal receiver may include a DUT holder. Thus, the signal S may be used as a test signal for the semiconductor devices.

For example, the interconnector 400 may include a first via 410 extending upwardly from the diverging line 200 (e.g., in the third direction III), a second via 420 extending downwardly from the output line 300 in the third direction III and a via line 430 connecting the first via 410 and the second via 420. For example, the first via 410 and the second via 420 may each extend lengthwise in the third direction III. For example, the first via 410 may extend between the diverging line 200 and the via line 430 and the second via 420 may extend between the via line 430 and the output line 300.

The first via 410 may extend upwardly from the diverging line 200 and may penetrate through the upper dielectric layer 150*a* and the upper ground layer 160*a*, and the second via 420 may extend downwardly from the output line 300 and may penetrate through the output dielectric layer 320 and the output ground layer 330. In such a case, the first via 410 and the second via 420 may be spaced apart from each other (e.g., in the first direction I) by a via gap distance D.

A buffer area B may be between the diverging line 200 and the output line 300, and the buffer area B may be filled with a buffer dielectric layer 440. The first via 410 may penetrate upwardly through the upper dielectric layer 160*a* and may enter into the buffer dielectric layer 440, and the second via 420 may penetrate downwardly through the output dielectric layer 330 and may enter into the buffer dielectric layer 440. For example, the first via 410 may be enclosed by the upper dielectric layer 150*a* and the buffer dielectric layer 440 and the second via 420 may be enclosed by the output dielectric layer 320 and the buffer dielectric layer 440.

The via line 430 may include a conductive line in the buffer area B and may extend in the first direction I in such a configuration that the first via 410 and the second via 420 may be connected to each other by the via line 430. For example, the diverging line 200 may be connected to the output line 300 through the first via 410, the via line 430, and the second via 420. Accordingly, the input line 100, the diverging line 200 and the output line 300 may be configured into a single transfer line through the via structure 400. The via line may include the low resistive conductive materials just like the first conductive line 140, the second conductive line 160, and the third conductive line 310.

In the present example embodiment, the first via 410 may include a first contact pad 411 in contact with the via line 430 and having a same surface area as the via line 430, and a first plug 412 extending upwardly from the diverging line 200 and in contact with the first contact pad 411. In addition, the second via 420 may include a second contact pad 421 in contact with the via line 410 and having a same surface area as the via line 430, and a second plug 422 extending downwardly from the output line 300 and in contact with the second contact pad 421 (e.g., or extending upwardly from the second contact pad 421).

In an implementation, an upper surface of the first contact pad 411 may be coplanar with an upper surface of the via line 430, and a lower surface of the second contact pad 421 may be coplanar with a lower surface of the via line 430.

The via line 430 may have substantially the same characteristic impedance as the diverging line 200. The diverging line 200 and the contact terminal 102 of the input line 100 may have the same characteristic impedance, and the contact terminal 102, the diverging line 200, and the via line 430 may have the same characteristic impedance. Further, the output line 300 may be controlled to have the same characteristic impedance as the via line 430.

The signal S may include a low frequency signal, the first and the second vias 410 and 420 may function as just connectors between the input line 100, the diverging line 200, the via line 430, and the output line 300, and thus the input line 100, the diverging line 200, the via line 430, and the output line 300 may constitute a single transfer line having no impedance discontinuity.

The signal S may include a high frequency signal, the first and the second vias 410 and 420 may function as an additional transfer line between the diverging line 200 and the output line 300, and thus the input line 100, the diverging line 200, the via line 430, and the output line 300 may constitute a multiple transfer line having various impedance discontinuities due to high frequency of the signal S.

In such a case, reflection loss of the high frequency signal S from the impedance discontinuity may be minimized or prevented just by controlling the via gap distance D between the first via 410 and the second via 420 to be under or less than a quarter wavelength of the high frequency signal S.

The high frequency signal S may be applied to the input terminal 101 of the input line 100, the first via 410 and the second via 420 may function as an individual impedance discontinuity point, and a first reflection signal may be reflected from the first via 410 and a second reflection signal may be reflected from second first via 420. The via gap distance D may be smaller than the quarter wavelength of the high frequency signal S, and the first reflection signal may be destructively interfered with the second reflection signal in the signal transfer structure 500.

For example, although the first via 410 and the second via 420 may function individually as the impedance discontinuities in the signal transfer of the high frequency signal, the first reflection signal and the second reflection signal may disappear or may be attenuated by the destructive interference between the first reflection signal and the second reflection signal, thereby preventing or minimizing the reflection loss of the high frequency signal when transferring through the input line 100, the diverging line 200 and the interconnector 400.

Accordingly, although the first via 410 and the second via 420 may function as an individual impedance discontinuity point when transferring the high frequency signal, the reflection loss of the high frequency signal may be minimized by controlling the via gap distance D to be below the quarter wavelength of the high frequency signal. Therefore, the signal transfer structure 500 may transfer both of the low frequency signal and the high frequency signal with high efficiency.

The configurations and positions of first and the second vias 410 and 420 may be varied according to the requirements and characteristics of the signal transfer structure 500 as long as the via gap distance D may be below the quarter wavelength of the high frequency signal.

Figure 7:
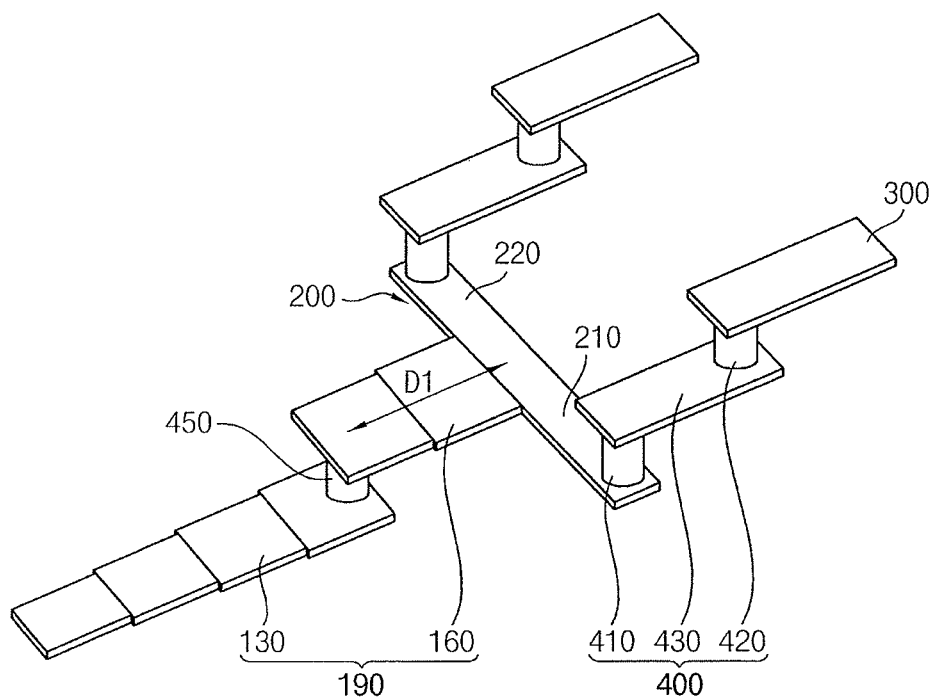
FIG. 7 illustrates a perspective view of a first modification of the signal transfer structure shown in FIG. 1.

FIG. 7 illustrates a perspective view of a first modification of the signal transfer structure shown in FIG. 1. In FIG. 7, a first modified signal transfer structure 501 may have substantially the same configurations as the signal transfer structure 500 shown in FIG. 1 except for a modified input line 190. In FIG. 7, the same reference numerals denote the same elements in FIG. 1 and further detailed descriptions on the same elements may be omitted hereinafter.

Referring to FIG. 7, the first modified signal transfer structure 501 may include a modified input line 190. The modified input line 190 may include a first separation line 130 (provided with the input terminal 101) and a second separation line 160 (provided with the contact terminal 102).

The first separation line 130 and the second separation line 160 may be connected to each other by a third via 450. The third via 450 may extend upwardly from the first separation line 130 in the third direction III and may contact a lower surface of the second separation line 160 (e.g., the third via 450 may extend between the first separation line and the second separation line 160). In an implementation, the third via 450 may be provided as a single via.

For example, the diverging line 200 may be controlled in such a way that the characteristic impedance of the diverging line 200 may be different from that of the contact terminal 102 and may be the same as that of the via line 430 and the output line 300. Then, the third via 450 may be spaced apart from the contact terminal 102 by a first gap distance D1, and the first gap distance D1 may be controlled to be the quarter wavelength of the high frequency signal S. Accordingly, the reflection loss of the high frequency signal S may be sufficiently minimized at the at the point of the third via 450.

The high frequency signal S may be applied to the input terminal 101 of the first separation line 130, the third via 450 may function as an impedance discontinuity, and a first reflection signal may be generated at the point of the third via 450. In contrast, the contact terminal 102 may also function as another impedance discontinuity since the characteristic impedance of the contact terminal 102 may be different from the diverging line 200. Thus, a second reflection signal may be generated at the point of the contact terminal 102.

The third via 450 and the contact terminal 102 may be spaced apart from each other by the quarter wavelength of the high frequency signal, the first reflection signal may be destructively interfered with the second reflection signal, and thus the first and the second reflection signals may disappear or may be minimized in the first modified signal transfer structure 501. Accordingly, the high frequency signal S may be transferred to the output line 300 without any signal loss.

In addition, the signal loss of the high frequency signal may be minimized between the diverging line 200 and the output line 300 by the same structures as described in detail with references to FIGS. 1 to 6.

For example, the input line 100 may be variously modified as long as the reflection loss at the impedance discontinuities of the input line 100 may be removed or sufficiently minimized by the destructive interference.

Figure 8:
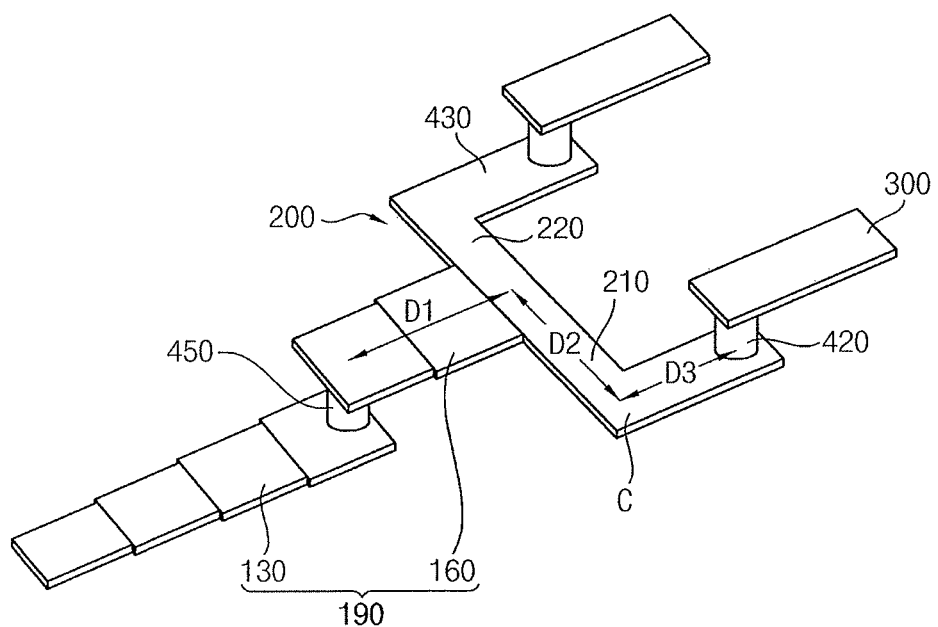
FIG. 8 illustrates a perspective view of a second modification of the signal transfer structure shown in FIG. 1.

FIG. 8 illustrates a perspective view of a second modification of the signal transfer structure shown in FIG. 1. In FIG. 8, a second modified signal transfer structure 502 may have substantially the same configurations as the first modified signal transfer structure 501 shown in FIG. 1 except that the first via 410 may be removed from the interconnector 400 and the via line 430 may make direct contact with the diverging line 200. In FIG. 8, the same reference numerals denote the same elements in FIG. 7 and further detailed descriptions on the same elements may be omitted hereinafter.

Referring to FIG. 8, the second modified signal transfer structure 502 may include a modified interconnector 401 having the second via 420 and the via line 430 without the first via 410 in such a configuration that the via line 430 may make direct contact with the diverging line 200 (without the first via 410 therebetween). Thus, the diverging line 200 may be directly connected to the via line 430, and the via line 430 may be connected to the output line 300 by way of the second via 420.

Thus, the contact terminal 102, the diverging line 200, and the via line 430 may have different characteristic impedance and the output line 300 may have the same characteristic impedance as the via line 430 and the contact point of the diverging line 200 and the via line 430 may function as an additional impedance discontinuity due to the shape variation.

In such a case, a second gap distance D2 between the contact terminal 102 and a contact point C may be controlled to be below the quarter wavelength of the high frequency signal and a third gap distance D3 between the second via 430 and the contact point C may also be controlled to be below the quarter wavelength of the high frequency signal. For example, although a third reflection signal may be generated at the contact point C and a fourth reflection signal may be generated at the second via 420, the third and the fourth reflection signals may be destructively interfered with each other and may be removed or minimized in the diverging line 200 and the via line 430, thereby minimizing the reflection loss of the high frequency signal in the diverging line 200 and the via line 430.

For example, the reflection signal reflected from the third via 450 may be removed by the destructive interference with the reflection signal reflected from the contact terminal 102, thereby minimizing the reflection loss in the first separation line 130 and the reflection signal reflected from the contact point C may be removed by the destructive interference with the reflection signal reflected from the second via 420.

Accordingly, the first to fourth reflection signals may disappear or may be minimized in the second modified signal transfer structure 502 and the high frequency signal S may be transferred to the output line 300 without any signal loss.

Figure 9:
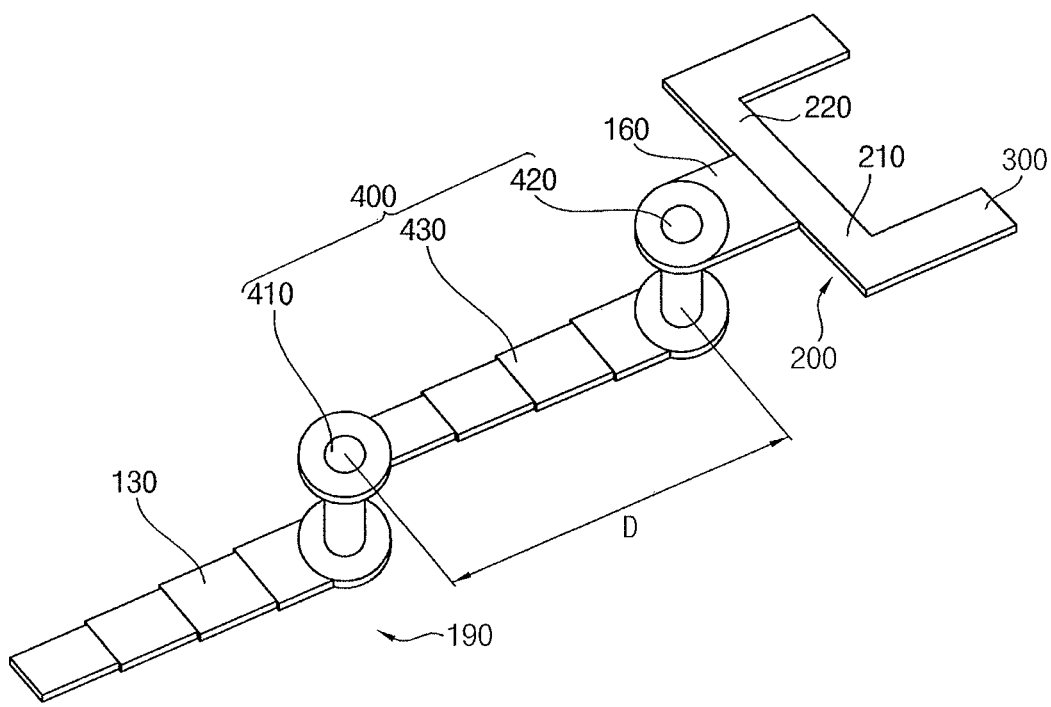
FIG. 9 illustrates a perspective view of a third modification of the signal transfer structure shown in FIG. 1.

FIG. 9 illustrates a perspective view of a third modification of the signal transfer structure shown in FIG. 1.

Referring to FIG. 9, a third modified signal transfer structure 503 may include the modified input line 190 having the first separation line 130 with the input terminal 101 may be provided and the second separation line 160 with which the contact terminal 102 may be provided. In the third modified signal transfer structure 503, the output line 300 may be directly connected with the diverging line 200.

The first separation line 130 and the second separation line 160 may be connected to each other by the interconnector 400 having the first via 410, the second via 420, and the via line 430. The configurations of the interconnector 400 for connecting the first and the second separation lines 130 and 160 may be substantially the same as the configurations of the interconnector 400 for connecting the diverging line 200 and the output line 300 as described in detail with references to FIGS. 5 and 6. Thus, further detailed descriptions on the configurations of the interconnector 400 for connecting the first and the second separation lines 130 and 160 may be omitted hereinafter.

As compared with the signal transfer structure 500 shown in FIG. 1, the diverging line 200 may be directly connected to the output line 300 and the interconnector 400 may be provided between the first and the second separation lines 130 and 160.

In such a case, the output line 300 may be modified in such a way that the output line 300 may have the same characteristic impedance as the diverging line 200. Thus, the output line 300 may be variously modified according to the characteristic impedance and the output line 300 shown in FIG. 9 may be exemplarily disclosed for a convenient of understandings.

The diverging line 200 may have substantially the same characteristic impedance as the contact terminal 102 of the second separation line 160 and the output line 300 may have substantially the same characteristic impedance as the diverging line 200. Thus, no impedance discontinuity may be generated along the second separation line 160, the diverging line 200 and the output line 300.

Accordingly, the impedance discontinuity may be generated only at the point of the first via 410 and the second via 420 when the high frequency signal is transferred by the third modified signal transfer structure 503. In the same configurations as the interconnector 400 in FIG. 1, the via gap distance D between the first via 410 and the second via 420 may be controlled to be below the quarter wavelength of the high frequency signal for minimizing the reflection loss in the interconnector 400.

For example, the via line 430 may also be shaped into a taper of which the width may increase from the first via 410 to the third via 430 step by step, thereby removing impedance discontinuity in the via line 430.

Figure 10:
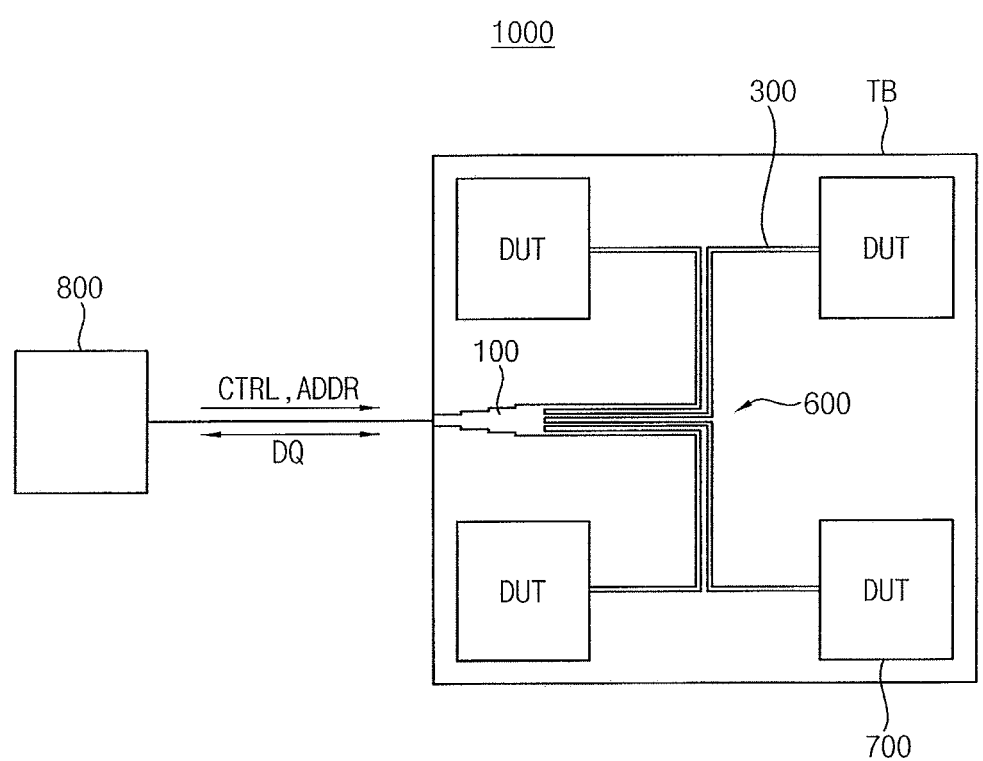
FIG. 10 illustrates a block diagram of a test apparatus for testing semiconductor devices having the signal transfer structure in accordance with an example embodiment.

FIG. 10 illustrates a block diagram of a test apparatus for testing semiconductor devices having the signal transfer structure in accordance with an example embodiment.

Referring to FIG. 10, a test apparatus 1000 in accordance with an example embodiment may include a test section 700 in which a plurality of the semiconductor devices under test (DUT) may be tested by a test process, a control section 800 generating a signal and controlling the test process and a signal transfer structure 600 to which the signal may be applied and diverging the signal into a plurality of test signals. The signal transfer structure 800 may transfer the diverged test signals to each DUT, respectively.

A test table may be arranged on each test section 700 and the semiconductor device under test may be loaded onto each test table. For example, the DUT may include a silicon wafer on which integrated chips (IC) may be arranged, a die into which the silicon wafer is separated by a dicing process and a semiconductor package to which a packaging process may be completed. A plurality of DUTs may be stacked in a cassette and the cassette may be moved to a test board TB of the test apparatus 1000 on which a plurality of the test table may be positioned. Then, each of the DUTs may be individually picked out of the cassette by a robot arm and may be individually loaded onto each test board of the test apparatus 1000.

The controller 800 may include various control processors for generating the signals for testing the DUTs and for controlling each test process to each DUT. In addition, the test results on each DUT may be transferred to the controller 800 and the controller 800 may analyze and store the test results.

For example, the controller 800 may generate various test signals such as a control signal CTRL for driving the reading and/or writing operations, an address signal ADDR for designating an address number of the DUT and a test data DQ for testing the DUT. The control signal CTRL may include various commanders for the writing operation and the reading operation. The address signal ADDR may write the test data DQ at the location designated by the address number in the writing operation mode. In addition, the address signal ADDR may read the test data DQ at the location designated by the address number in the reading operation mode.

In the present example embodiment, the signal generated may be generated from the controller 800 and may be transferred to the test board TB. The signal may include a high frequency signal having a frequency of about 4 GHz to about 15 FHz. At an initial time of the test process to the DUT, the signal may be applied to the signal transfer structure 600 on the test board TB.

In the present example embodiment, the signal transfer structure 600 may include a tapered input line 100 extending in a first direction and having an input terminal to which the signal may be applied and a contact terminal such that the a width of the input line 100 may increase from the input terminal to the contact terminal in the first direction, a diverging line contact with the contact terminal of the input line 100 and extending in a second direction, at least an output line from which the signal may be output, and an interconnector connecting with the diverging line and the output line and having a first via, a second and a via line for connecting the first via and the second via.

The signal transfer structure 600 may have substantially the same structures as the signal transfer structures described in detail with references to FIGS. 1 and 9. Thus, any detailed descriptions on the signal transfer structure 600 area omitted hereinafter.

For example, the width of the input line 100 may increase step by step along a signal transfer direction, so that the characteristic impedance of the input line 100 may be matched with that of the diverging line 200. In addition, the first via and the second via may be controlled spaced apart from each other by a via gap distance below the quarter wavelength of the high frequency signal. Thus, although the high frequency signal may be applied to the input line 100 and the interconnector 400 may function as an impedance discontinuity, the reflection signals reflected from the first via and the second via may be removed or minimized due to the destructive interference therebetween, thereby minimizing the reflection loss of the high frequency signal. Accordingly, the reliability of the test apparatus may be sufficiently improved due to the minimized reflection loss.

By way of summation and review, due to the recent trends of high performance and high integration degree of the semiconductor devices, the circuit board of the ATE may be changed into a multilayer board from a single layer board. Thus, the signal integrity of the test signal could be changed by an impedance discontinuity at interconnectors for connecting the multilayers of the circuit board as well as by an impedance discontinuity at diverge points between the input line and the branch lines. In the multilayer board, a lower signal transfer line horizontally extending in a lower layer may be connected to an upper signal transfer line horizontally extending in an upper layer by the vertical via structure. Thus, the impedance of the signal line could be changed at the point at which the via structure is positioned.

The efficiency of the signal transfer may be maximized on condition that the impedance of the signal line is continuous or unchanged along a signal line from the input line to the output line. For example, the impedance discontinuity may be minimized along the transfer line for increasing the efficiency of the signal transfer.

The test signal may be reflected from the discontinuity point of the impedance and then the reflection signal could interfere with another test signal in the input line. For example, the test signal could be attenuated gradually due to the signal destructive interference between the reflection signal and the test signal. The attenuation of the test signal in the input line could cause a rise and/or fall in time latency, which makes it difficult to set a sufficiently large eye margin for an eye diagram in ATE.

For example, when a high frequency signal is transferred as the test signal, the wavelength of the high frequency may be so short that the via structure, which is a just interconnector for connecting transfer lines apart from each other, functions as an additional transfer line in reality. For example, the via structure may be handled in the signal analysis as if the via structure were a signal line different from the original transfer lines.

In such a case, the impedance of the transfer line may become additionally discontinuous at the via structure, and as a result, the return loss of the test signal may tend to increase along a whole transfer line due to the additional impedance discontinuity at the point of the via structure.

According to an embodiment, a single signal may be applied to the signal transfer structure and may be diverged into a plurality of test signals and may transfer the diverged test signals to a plurality of devices under test (DUT), respectively, with sufficiently reduced reflection loss of the signal even when the high frequency signal may be applied. The input line to which the signal may be applied may be shaped into a taper of which the width may increase step by step along the signal transfer direction, thereby sufficiently matching the characteristic impedance of the input line with that of the diverging line for through which the signal is diverged to the test signals. For example, a couple of the neighboring impedance discontinuity points may be controlled spaced apart from each other by a gap distance that is below the quarter wavelength of the high frequency signal, so that the reflections signals reflected from each of the impedance discontinuity points may be removed or minimized by the destructive interference between the reflective signals. Thus, the signal may be transferred with sufficient integrity in the signal transfer structure regardless of the high frequency signal and the low frequency signal and the test apparatus may increase the test reliability by using the signal transfer structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A signal transfer structure, comprising:
 a tapered input line extending in a first direction and having an input terminal and a contact terminal, a width of the input line measured in a second direction different from the first direction and increasing from the input terminal to the contact terminal in the first direction such that a plane of the input line is defined by an orthogonal coordinate system of the first direction and the second direction and a signal is input to the input terminal;
 a diverging line in contact with the contact terminal of the input line and extending in the second direction such that a plane of the diverging line is parallel with the plane of the input line and is defined by the orthogonal coordinate system;

an output line spaced apart from the diverging line in a third direction substantially perpendicular to both of the first direction and the second direction and from which the signal is output such that a plane of the output line is parallel with the plane of the input line and is defined by the orthogonal coordinate system; and an interconnector interconnecting the diverging line and the output line, the interconnector including a vertical via that extends in the third direction between the diverging line and the output line and a via line that extends in the first direction and is connected to the vertical via such that the interconnector has a same characteristic impedance as the output line.

2. The signal transfer structure as claimed in claim 1, wherein the vertical via includes:

a first via extending upwardly from the diverging line in a third direction perpendicular to the first direction and the second direction, and a second via extending downwardly from the output line in the third direction such that the first via and the second via are electrically connected to each other by the via line.

3. The signal transfer structure as claimed in claim 2, wherein the via line has a same characteristic impedance as the diverging line and extends in the first direction such that the first via and the second via are spaced apart in the first direction and are positioned at different levels in the third direction, an upper surface of the first via making contact with a lower surface of the via line and a lower surface of the second via making contact with an upper surface of the via line.

4. The signal transfer structure as claimed in claim 3, wherein:

the signal includes a baseband digital signal, and the first via and the second via are spaced apart by a via gap distance that is below a quarter wavelength of the baseband digital signal.

5. The signal transfer structure as claimed in claim 3, wherein the diverging line has a same characteristic impedance as the contact terminal such that the contact terminal, the diverging line, the via line, and the output line has the same characteristic impedance.

6. The signal transfer structure as claimed in claim 3, wherein the input line is separated into a first separation line having the input terminal and a second separation line having the contact terminal, the first separation line and the second separation line being positioned at different levels.

7. The signal transfer structure as claimed in claim 6, further comprising a third via connecting the first separation line with the second separation line.

8. The signal transfer structure as claimed in claim 7, wherein:

the diverging line has a characteristic impedance that is different from the contact terminal, and the third via is spaced apart from the contact terminal by a gap distance that is below a quarter wavelength of the signal.

9. The signal transfer structure as claimed in claim 1, wherein:

the input line is separated into a first separation line having the input terminal and a second separation line having the contact terminal such that the first separation line and the second separation line are positioned at different levels and are connected with each other by an additional vertical via extending in the third direction between the first separation line and the second separation line; and the vertical via extends upwardly from the via line such that the vertical via makes contact with the output line and the via line makes contact with the diverging line.

10. The signal transfer structure as claimed in claim 9, wherein the contact terminal, the diverging line, and the via line have a different characteristic impedance.

11. The signal transfer structure as claimed in claim 10, wherein a first gap distance between the additional vertical via and the contact terminal, a second gap distance between the diverging line around the contact terminal and a contact point of the diverging line and the via line, and a third gap distance between the via line around the diverging line and the vertical via are below a quarter wavelength of the signal.

12. The signal transfer structure as claimed in claim 1, wherein the width of the input line increases in a stepwise manner.

13. The signal transfer structure as claimed in claim 1, wherein the width of the input line increases in a continuous manner.

14. The signal transfer structure as claimed in claim 1, wherein the vertical via includes:

a first via connecting the diverging line and the via line, and a second via spaced apart from the first via and connecting the output line and the via line such that the first via is connected to the second by the via line.

15. A signal transfer structure, comprising:

a tapered input line extending in a first direction and having an increasing width along the first direction such that the input line is separated into a first separation line having an input terminal to which a signal is input and a second separation line having a contact terminal at different level;

a diverging line in contact with the contact terminal of the input line and extending in a second direction that is different from the first direction;

an output line directly connected to the diverging line and from which the signal is output; and an interconnector interconnecting the first separation line and the second separation line and having a first via, a second via, and a via line such that:

the first via extends upwardly from the first separation line in a third direction that is substantially perpendicular to the first and the second directions to thereby make contact with the via line;

the second via extends downwardly from the second separation line in the third direction to thereby make contact with the via line;

planes of the first separation line, the second separation line, and the via line are parallel and are spaced apart in the third direction; and the via line has a substantially same characteristic impedance as those of the first separation line and the second separation line.

16. The signal transfer structure as claimed in claim 15, wherein:

the signal includes a baseband digital signal, and the first via and the second via are spaced apart by a via gap distance that is below a quarter wavelength of the baseband digital signal.

17. The signal transfer structure as claimed in claim 15, wherein the via line has a taper shape in which a width thereof increases from the first via to the second via.

18. The signal transfer structure as claimed in claim 17, wherein the width of the via line increases in a stepwise manner.

19. The signal transfer structure as claimed in claim 15, wherein the second separation line, the diverging line, and the output line have a same characteristic impedance such that no impedance discontinuity is generated along the second separation line, the diverging line, and the output line.

20. The signal transfer structure as claimed in claim 15, wherein the width of the input line increases in a stepwise manner.

\* \* \* \* \*